US012660097B2

(12) United States Patent
Ryu et al.

(10) Patent No.: US 12,660,097 B2
(45) Date of Patent: Jun. 16, 2026

(54) ELECTRONIC PACKAGE AND METHOD FOR FORMING THE SAME

(71) Applicant: JCET STATS ChipPAC Korea Limited, Incheon (KR)

(72) Inventors: HyoDong Ryu, Incheon (KR);
SeungHyun Lee, Incheon (KR);
WonSang Rhee, Incheon (KR);
HunTaek Lee, Gyeonggi-do (KR);
KyoungHee Park, Seoul (KR)

( * ) Notice: Subject to any disclaimer, the term of this patent is extended or adjusted under 35 U.S.C. 154(b) by 217 days.

(21) Appl. No.: 18/459,008

(22) Filed: Aug. 30, 2023

(65) Prior Publication Data

US 2024/0098907 A1 Mar. 21, 2024

(30) Foreign Application Priority Data

Sep. 21, 2022 (CN) .......................... 202211152895.1

(51) Int. Cl.
*H05K 3/3485* (2026.01)
*H05K 3/341* (2026.01)

(52) U.S. Cl.
CPC ......... *H05K 3/3485* (2020.08); *H05K 3/3436* (2013.01)

(58) Field of Classification Search
CPC .............. H05K 3/3485; H05K 3/3436; H05K 2201/09381; H05K 2201/10636; H05K 2201/10643; H05K 3/3442; H05K 1/111; H01L 24/83; H01L 23/49811; H01L 24/32; H01L 2224/32014; H01L 2224/32056; H01L 2224/32221; H01L 2224/83192; H01L 2224/83815
See application file for complete search history.

(56) References Cited

U.S. PATENT DOCUMENTS

| | | | | |
|---|---|---|---|---|
| 5,838,070 A | * | 11/1998 | Naruse | .................... H05K 1/111 361/768 |
| 6,610,430 B1 | * | 8/2003 | Thompson, Sr. | .... H05K 3/3485 428/209 |
| 9,148,955 B2 | * | 9/2015 | Ahn | ...................... H05K 3/3442 |
| 2005/0082686 A1 | * | 4/2005 | Liu | ...................... H05K 3/3442 257/780 |

FOREIGN PATENT DOCUMENTS

| | | |
|---|---|---|
| KR | 1020010017187 A | 3/2001 |
| TW | 200727376 A | 7/2007 |
| TW | M337213 U | 7/2008 |
| TW | 200841440 A | 10/2008 |
| TW | 202209604 A | 3/2022 |
| TW | I760272 B | 4/2022 |

\* cited by examiner

*Primary Examiner* — Timothy J Thompson
(74) *Attorney, Agent, or Firm* — .Junhe Law Office, P.C.; Yi Zhang

(57) ABSTRACT

Provided is an electronic component, comprising: a substrate; a first set of conductive pads on the substrate and at which a set of terminals of a first electronic component are to be mounted, respectively; and solder paste formed on each of the first set of conductive pads, wherein the solder paste exposes a portion of a surface of a conductive pad that is facing away from the others of the first set of conductive pads but does not substantially expose another portion of the surface of the conductive pad that is facing towards the others of the first set of conductive pads.

9 Claims, 9 Drawing Sheets

200

201 providing a substrate

202 forming solder paste

203 placing the first electronic component

204 reflowing the solder paste

ELECTRONIC PACKAGE AND METHOD FOR FORMING THE SAME

TECHNICAL FIELD

The present application generally relates to semiconductor technologies, and more particularly, to an electronic package and a method for forming an electronic package.

BACKGROUND OF THE INVENTION

The semiconductor industry is constantly faced with complex integration challenges as consumers want their electronic products to be lighter, smaller and have higher performance with more and more functionalities. Conventionally, in an electronic package, various electronic components need to be attached onto a substrate to achieve desired electrical interconnection. In order to accommodate the various electronic components in a limited space on the substrate, a tight layout may be implemented where electronic components are very close to each other. However, as illustrated below, in such tight layout, an undesired solder bridge between adjacent electronic components may be formed during a soldering process for attaching electronic components on the substrate, especially between adjacent terminals of two electronic components.

Referring to FIG. 1A and FIG. 1B, top views of a portion of a substrate 100 before and after a soldering process are shown. The portion of the substrate 100 is formed with two sets of conductive pads, which are used for mounting two electronic components thereon using surface mount technology (SMT), for example. Specifically speaking, as shown in FIG. 1A, a first set of conductive pads 110 includes two spaced-apart pads 110a and 110b, and a second set of conductive pads 120 includes two spaced-apart pads 120a and 120b. On top of the conductive pads 110a, 110b, 120a and 120b, solder pastes 130a, 130b, 140a, and 140b are formed, respectively. Each solder paste covers an area that generally conforms to the conductive pad underneath. On top of the solder pastes, electronic components can be mounted. In particular, as shown in FIG. 1B, an electronic component 150 includes two terminals 151a and 151b for electrical connection with other components on the substrate, and a body 152. Similarly, another electronic component 160 includes two terminals 161a and 161b for electrical connection with other components, and a body 162. The electronic components 150 and 160 are placed on top of the first and the second sets of conductive pads 110 and 120, respectively.

After a reflow process, the terminals 151a and 151b of the electronic component 150 are metallurgically connected to the solder pastes 130a and 130b, and thereby electrically connected to the conductive pads 110a and 110b, respectively. Similarly, the terminals 161a and 161b of the electronic component 160 are metallurgically connected to the solder pastes 140a and 140b, thereby electrically connected to the conductive pads 120a and 120b, respectively.

However, there exists a risk of forming a solder bridge in two steps. Firstly, upon placing the electronic components 150 and 160 on the substrate with certain pressure, the solder paste underneath may be squeezed and expand onto a larger area outside of the corresponding conductive pad. Also, in the reflow process, the melted solder pastes 130a, 130b, 140a and 140b may flow and cover a larger area compared to an area before reflowing. Due to the above reasons, the solder pastes 130b and 140a on adjacent conductive pads 110b and 120a may form an undesired solder bridge between them. That is to say, there exists a risk that adjacent solder pastes may become in contact with each other after the reflow process. As a result of such risk, the electronic components 150 and 160 may be short-circuited, and an electronic package including the electronic components 150 and 160 may malfunction, rendering a lower yield. Therefore, a need exists for an improved method for forming an electronic package.

SUMMARY OF THE INVENTION

An objective of the present application is to provide a method for forming an electronic package, with an improved effect in avoiding solder bridges in an electronic package.

According to one aspect of the present application, a method for forming an electronic package is provided, comprising: providing a substrate, wherein the substrate comprises a first set of conductive pads at which a set of terminals of a first electronic component are to be mounted, respectively; forming solder paste on each of the first set of conductive pads, wherein the solder paste exposes a portion of a surface of a conductive pad that is facing away from the others of the first set of conductive pads but does not substantially expose another portion of the surface of the conductive pad that is facing towards the others of the first set of conductive pads; placing the first electronic component on the substrate with each of the set of terminals of the first electronic component aligned with one of the first set of conductive pads; and reflowing the solder paste on the first set of conductive pads to secure the first electronic component onto the substrate.

According to another aspect of the present application, an electronic package formed with the above method is provided.

According to another aspect of the present application, an electronic component is provided.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain the principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

FIGS. 3A-2, 3B-2, 3C-2, and 3D-2 illustrate perspective views of steps of the method shown in FIGS. 3A-1, 3B-1, 3C-1, and 3D-1 according to an embodiment of the present application.

FIG. 3E-1 and FIG. 3E-2 illustrate X-ray inspections of an electronic package formed with a conventional method and the present method, respectively.

The same reference numbers will be used throughout the drawings to refer to the same or like parts.

DETAILED DESCRIPTION OF THE INVENTION

Figure 1A:
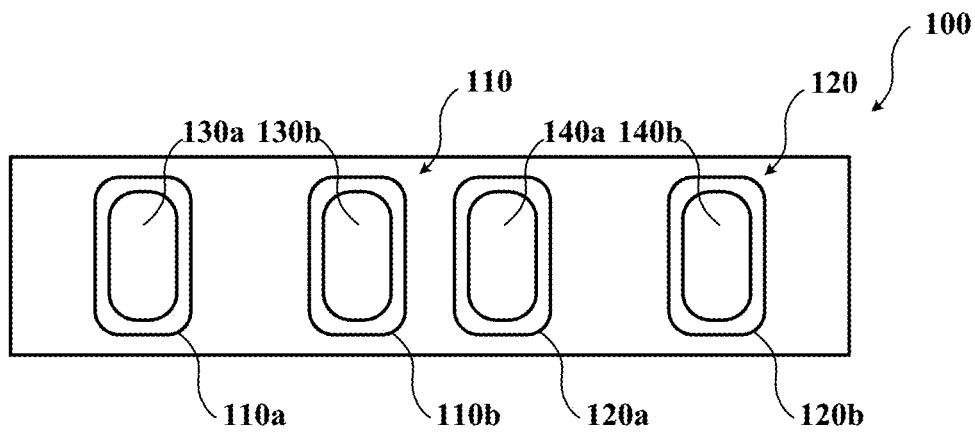
FIG. 1A illustrates a top view of a portion of a conventional substrate before soldering.

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In electronic devices, various electronic components are integrated together on a same substrate. Conventionally, the various electronic components are attached onto the substrate using a soldering process. In order to integrate the various electronic components within a limited space of the substrate, the layout of the electronic components is specifically designed. In the designed layout, electronic components that are electrically coupled are not necessarily spatially adjacent to each other, and electronic components that are spatially adjacent to each other are not necessarily electrically coupled. Yet, as illustrated above, solder pastes at adjacent positions may form solder bridges after a reflow process and cause undesired electrical connections therebetween. In the present application, a method for forming an electronic package is proposed with an improved effect in avoiding solder bridges formed between adjacent electronic components of the electronic package.

Figure 2:
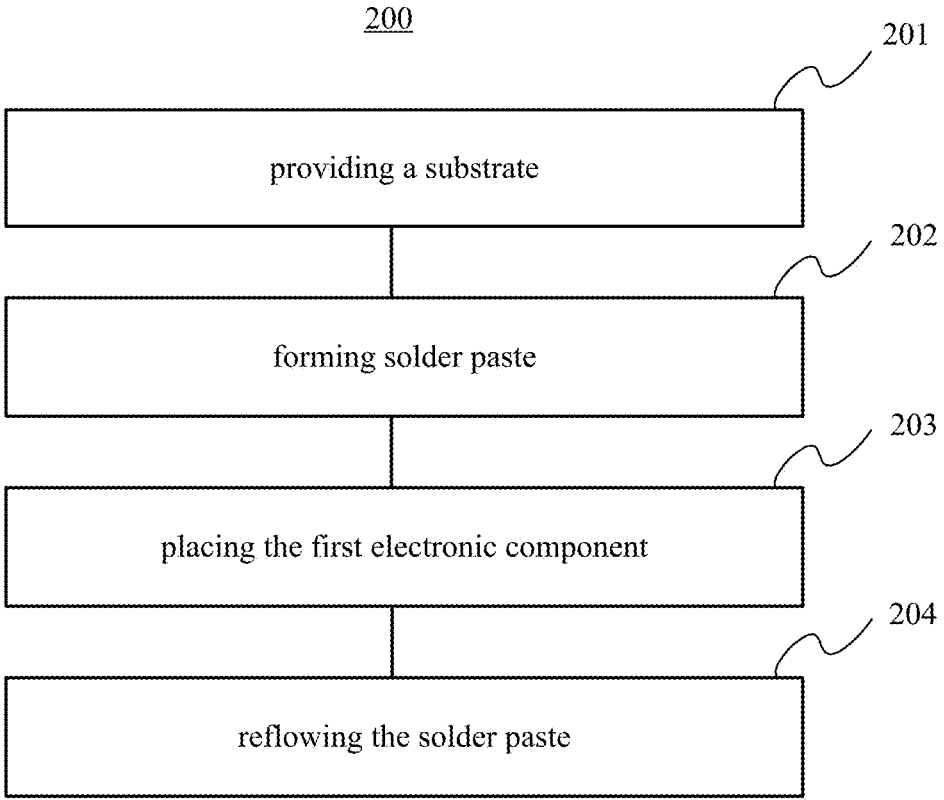
FIG. 2 illustrates a flowchart of a method for forming an electronic package according to an embodiment of the present application.

FIG. 2 illustrates a flowchart of a method 200 for forming an electronic package according to an embodiment of the present application. FIGS. 3A-1, 3B-1, 3C-1, and 3D-1 illustrate top views of steps of the method 200 according to an embodiment of the present application. FIGS. 3A-2, 3B-2, 3C-2, and 3D-2 illustrate perspective views of the steps shown in FIGS. 3A-1, 3B-1, 3C-1, and 3D-1.

As shown in FIG. 2, the method 200 starts with step 201, i.e., a substrate is provided. The substrate includes a first set of conductive pads where a set of terminals of a first electronic component are to be mounted. Then a solder paste with certain shape is formed on each of the first set of conductive pads as in step 202. The shape of the solder paste will be illustrated in more details as follows. In step 203, the first electronic component is placed on the substrate, wherein each of the set of terminals is aligned with one of the first set of conductive pads. Finally, in step 204, the solder paste is reflowed such that the first electronic component is secured to the first set of conductive pads. The steps shown in FIG. 2 is illustrated in more details with more drawings as follows.

Figures 1, 3A:
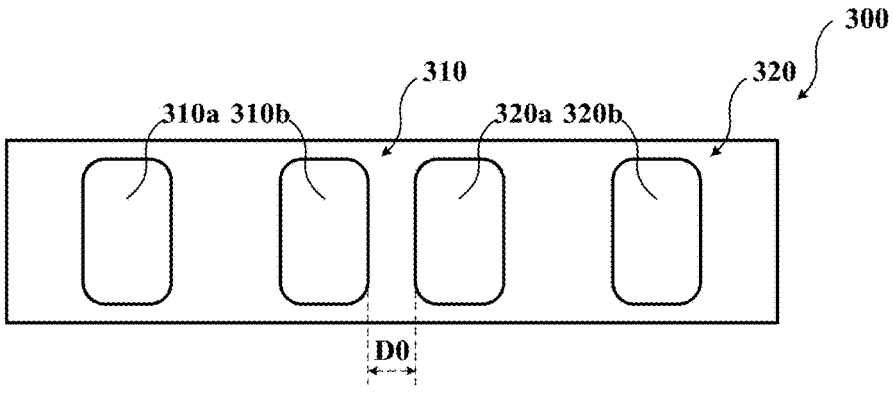
FIGS. 3A-1, 3B-1, 3C-1, and 3D-1 illustrate top views of steps of the method shown in FIG. 2 according to an embodiment of the present application.
Figures 2, 3A:
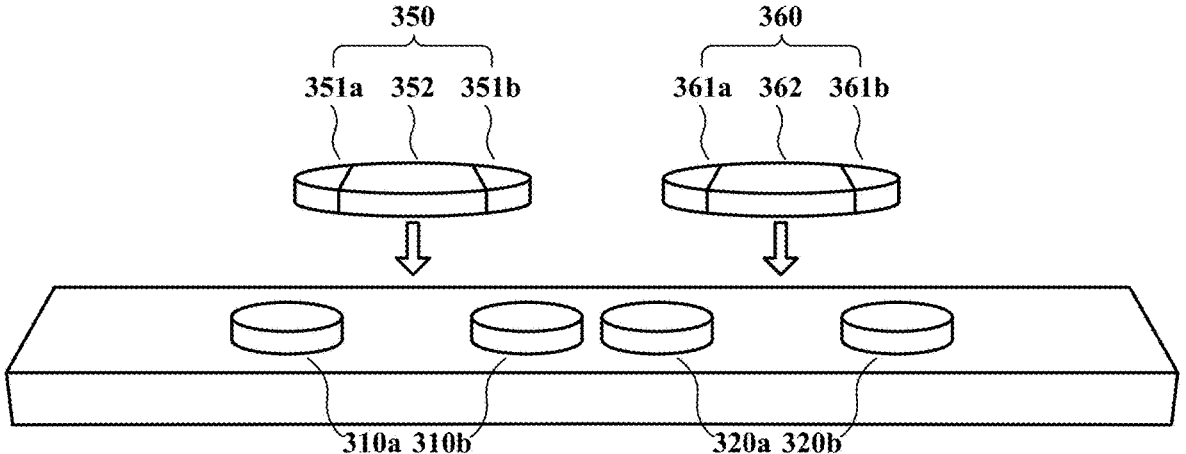

Specifically speaking, as shown in FIG. 3A-1, in an embodiment, a substrate 300 includes a first set of conductive pads 310 and a second set of conductive pads 320. In particular, the first set of conductive pads 310 include two conductive pads 310a and 310b. Similarly, the second set of conductive pads 320 include two conductive pads 320a and 320b. Preferably, each conductive pad may take the form of a rounded rectangle. At the two sets of conductive pads 310 and 320, two electronic components are to be mounted, respectively in a later step. In an embodiment, each set of conductive pads 310 and 320 includes two conductive pads, and each set is to be mounted with a 01005-type electronic component. As shown in FIG. 3A-1, a distance DO between two adjacent conductive pads of the two sets of conductive pads 310 and 320 is smaller than 65 um, preferably 40 um to 60 um. It can be appreciated that, each of the set of conductive pads may take other possible forms; there may be any number of conductive pads in a set of conductive pads; and two adjacent sets of conductive pads may include different number of conductive pads. For example, a set of conductive pads may include four conductive pads each being positioned at an edge or a corner of a rectangular layout. Aspects of the present application are not limited thereto.

Referring to FIG. 3A-2, a perspective view of the substrate 300 shown in FIG. 3A-1 is illustrated. A first electronic component 350 may be mounted onto the substrate, which includes a set of terminals 351a, 351b and a body 352. The set of terminals 351a, 351b are used for electrical connection with other components on the substrate. The set of terminals 351a, 351b are to be mounted on top of the first set of conductive pads 310a and 310b, respectively. Similarly, a second electronic component 360 includes a set of terminals 361a, 361b and a body 362. The set of terminals 361a, 361b are to be mounted on top of the second set of conductive pads 320a and 320b, respectively. It can be appreciated that, in other embodiments, each of the first electronic component

350 and the second electronic component 360 may include any number of terminals, such as three terminals of a transistor.

Figures 1, 3B:
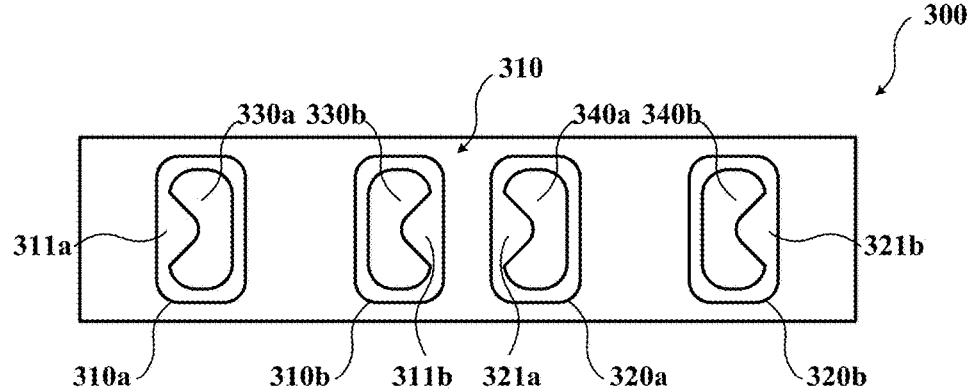
Figures 2, 3B:
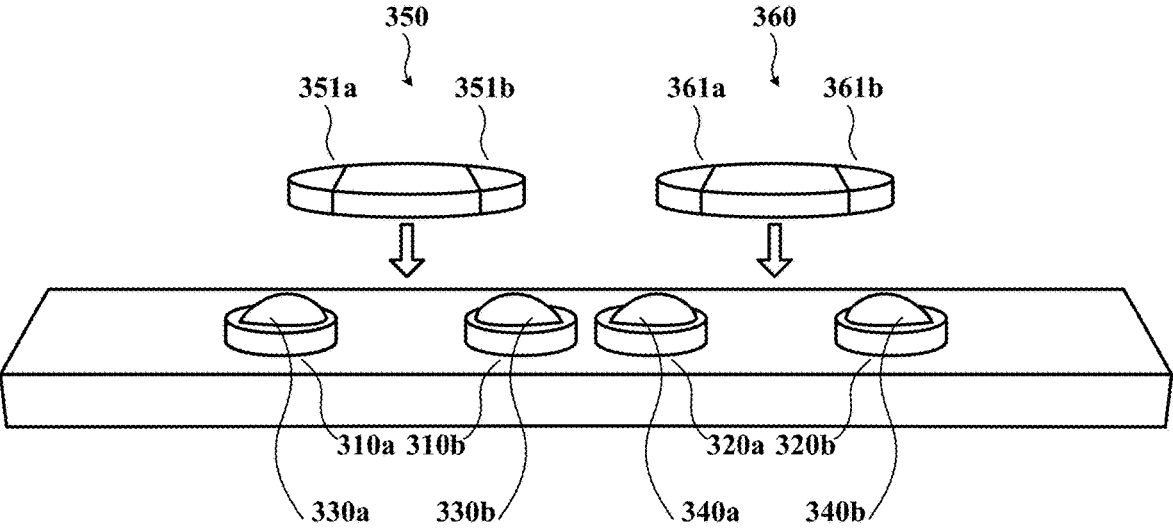
Figure 7:
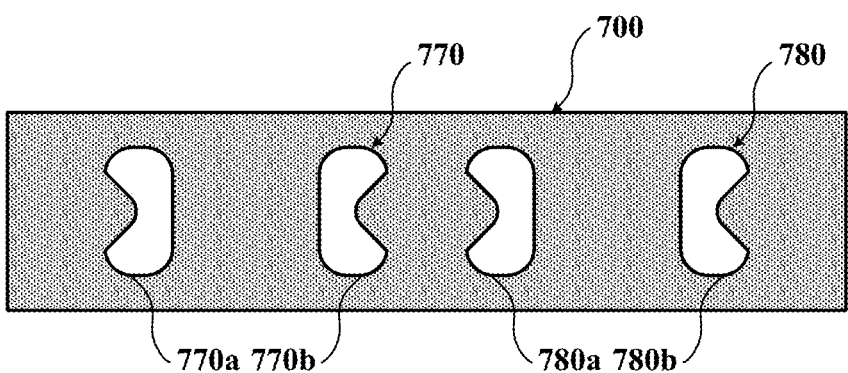
FIG. 7 illustrates a top view of a stencil according to an embodiment of the present application.

Referring to FIG. 3B-1, solder paste is formed on each conductive pad, such as by a depositing process. Specifically, solder paste 330a is formed on the conductive pad 310a, and the solder paste 330a does not cover the entire surface of the conductive pad 310a but exposes a portion 311a of a surface of the conductive pad 310a. The exposed portion 311a of the conductive pad 310a is facing away from the other conductive pad i.e., the conductive pad 310b of the set of conductive pads 310. Similarly, solder paste 330b exposes a portion 311b of a surface of the conductive pad 310b, and the exposed portion 311b is facing away from the other conductive pad 310a. Solder pastes 340a, 340b are similarly formed on top of the conductive pads 320a and 320b, partially exposing surfaces 321a and 321b of the conductive pads 320a and 320b, respectively. It can be appreciated that, solder paste is a three-dimensional structure and has certain thickness. In the above embodiments, the solder paste may generally take a same shape vertically, i.e., the shape of the solder paste in a direction perpendicular to the surface of the substrate does not change significantly. In some embodiments, the solder paste is formed by stencil printing on the corresponding conductive pad. A stencil used for forming a solder paste will be illustrated in more details as shown in FIG. 7.

FIG. 3B-2 shows a perspective view of the substrate shown in FIG. 3B-1. A distance between the two terminals 351a and 351b of the first electronic component 350 is generally equal to a distance between the two spaced-apart solder pastes 330a and 330b on top of the two spaced-apart conductive pads 310a and 310b. Similarly, a distance between the two terminals 361a and 361b of the second electronic component 360 is generally equal to a distance between the two spaced-apart solder pastes 340a and 340b on top of the two spaced-apart conductive pads 320a and 320b.

Figure 1B:
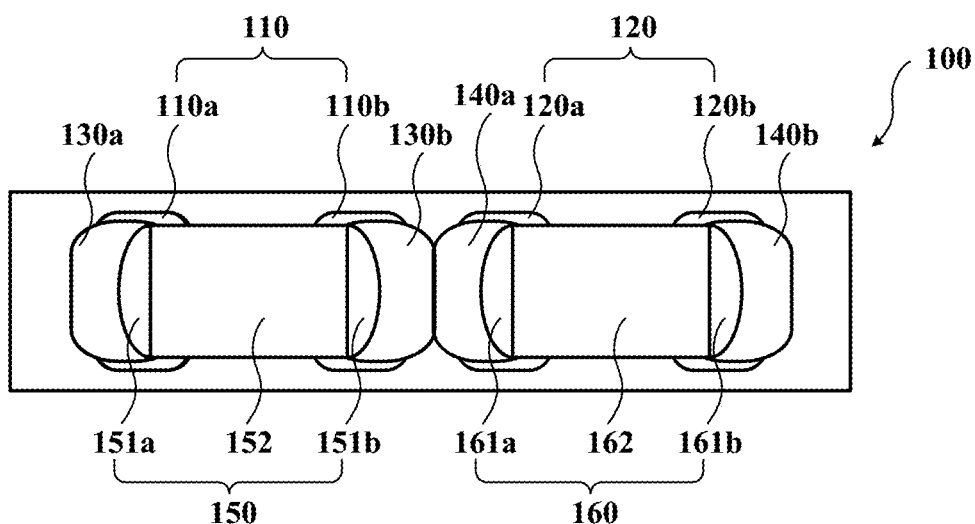
FIG. 1B illustrates a top view of a portion of a conventional substrate after soldering.
Figures 1, 3C:
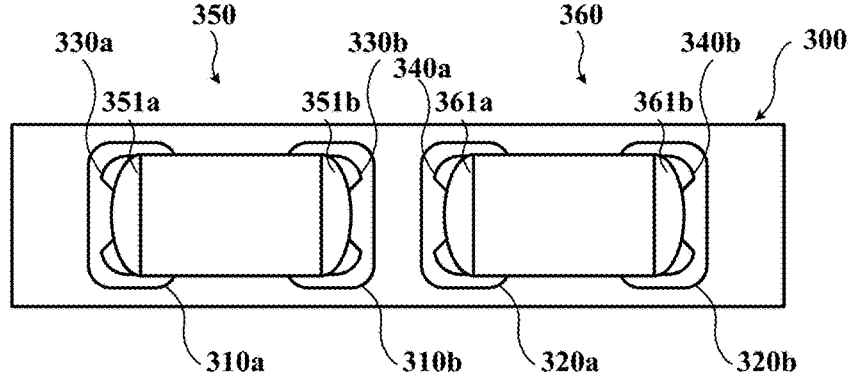
Figures 2, 3C:
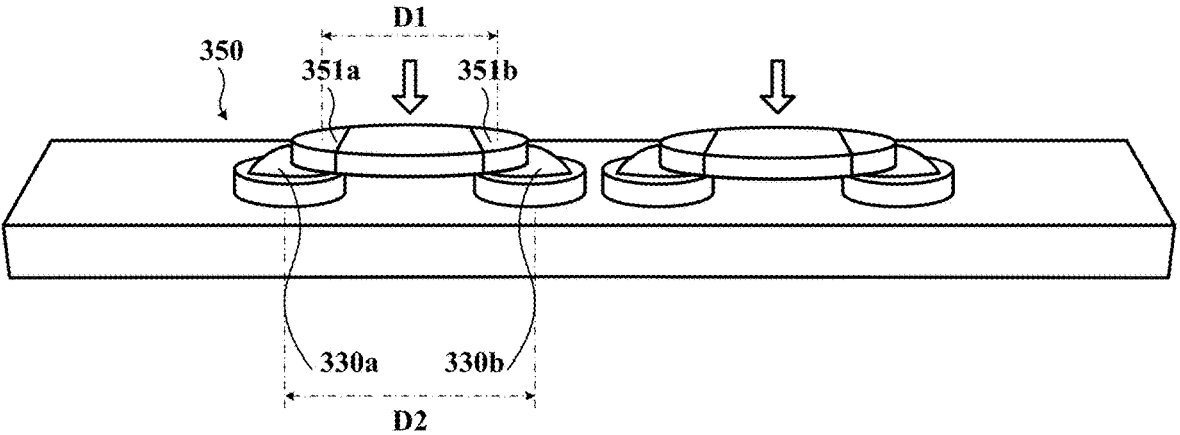

Referring to FIG. 3C-1, the first and the second electronic components 350 and 360 are placed onto the substrate 300. Specifically speaking, the set of terminals 351a and 351b of the first electronic component 350 are placed on the set of conductive pads 310a and 310b, in particular, the terminal 351a at least partially overlaps with the solder paste 330a, and the terminal 351b at least partially overlaps with the solder paste 330b. Similarly, the terminal 361a of the second electronic component 360 at least partially overlaps with the solder paste 340a on top of the conductive pad 320a, and the terminal 361b at least partially overlaps with the solder paste 340b on top of the conductive pad 320b. Preferably, the terminals of the electronic components are generally aligned to the corresponding conductive pads, respectively. It can be appreciated that, in addition to the distance between the solder paste and the periphery of the conductive pad in the conventional solder paste setting as shown in FIG. 1B, the designed exposed portion of the conductive pad may further accommodate the squeezed solder paste, and the overall risk of the solder paste to flow outside the conductive pad is reduced.

FIG. 3C-2 shows a perspective view of the substrate shown in FIG. 3C-1. It can be appreciated that, a distance between terminals of an electronic component may be larger than, equal to or smaller than a distance between corresponding solder pastes underneath, so long as each terminal at least partially overlaps with the solder paste underneath so that the electronic component may be further soldered with the solder paste to be secured onto the substrate. For example, a distance D1 between the terminals 351a and 351b of the electronic component 350 may be smaller, equal to or larger than a distance D2 between solder pastes 330a and 330b. It can be appreciated that, for terminals of different electronic components, the configuration of the distances may be different.

Figures 1, 3D:
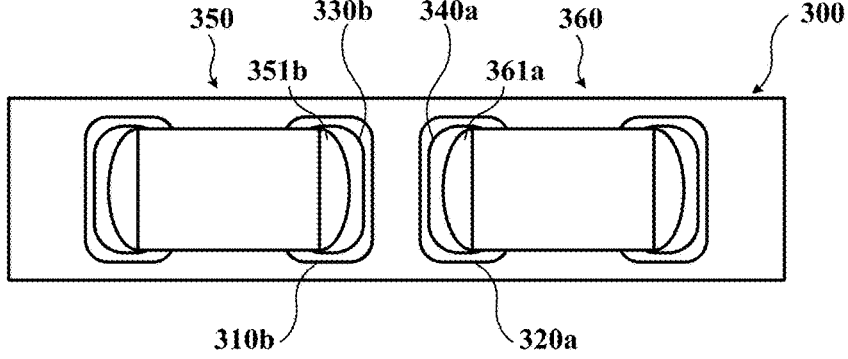
Figures 2, 3D:
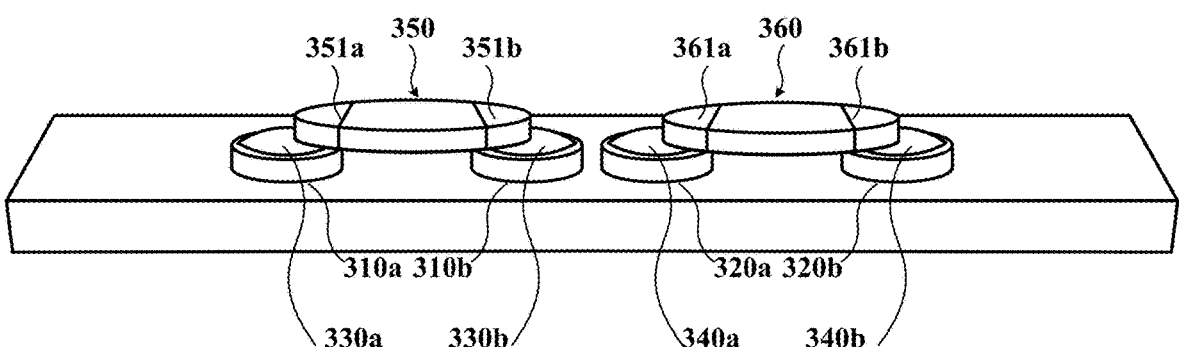

Referring to FIG. 3D-1, after a soldering process, electronic components may be secured onto the substrate. Take a terminal 351b of the electronic component 350 as an example. The solder paste 330b under the terminal 351b may be reflowed, and the terminal 351b is secured to the substrate 300 via the solder paste 330b. Specifically, the terminal 351b is metallurgically connected to the solder paste 330b, thereby electrically and mechanically connected to the conductive pad 310b on the substrate 300. Similarly, the terminal 361a of the electronic component 360 is metallurgically connected to the solder paste 340a, thereby electrically and mechanically connected to the conductive pad 320a on the substrate 300. During the reflow process, the solder paste may be melted and flow on the conductive pad to some extent. Thus, the solder pastes 330b and 340a may flow and cover a larger area compared to an area before a reflow process (see FIG. 3B-1). Since the solder paste 330b and 340a are configured to not cover the entirety of the pads 310b and 320a underneath, specifically, configured to expose portions 311b and 321a (see FIG. 3B-1), the solder pastes 330b and 340a may desirably not flow excessively over an area of the conductive pads 310b and 320a underneath, and the solder pastes 330b and 340a may desirably not become in contact with each other, that is, forming a solder bridge. Preferably, the solder pastes 330b and 340a may not flow excess an area of the conductive pads 310b and 320a underneath, respectively.

See FIG. 3D-2 for a perspective view of the substrate shown in FIG. 3D-1. Preferably, after a reflow process, the electronic component 350 is secured to the substrate 300, and the set of terminals 351a and 351b are secured to the solder paste 330a and 330b on top of the conductive pads 310a and 310b, respectively. Preferably, the solder pastes 330a and 330b do not flow outside the conductive pads 310a and 310b, respectively. Similarly, the solder pastes 340a and 340b preferably do not flow outside the conductive pads 320a and 320b, respectively. Therefore, the solder pastes 330b and 340a on top of the adjacent conductive pads 310b and 320a are not in contact with each other after the reflow process, that is, not formed with a solder bridge therebetween, and the electronic components 350 and 360 are not undesirably short circuited.

Figures 1, 3E:
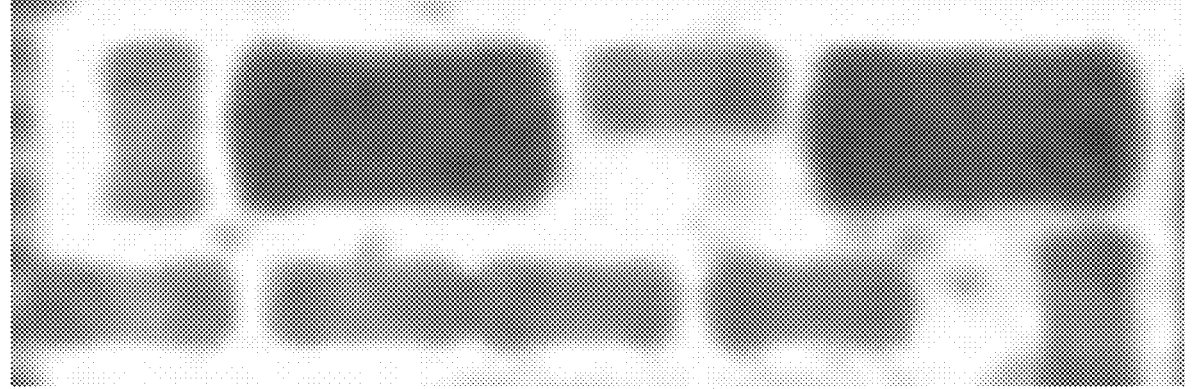
Figures 2, 3E:
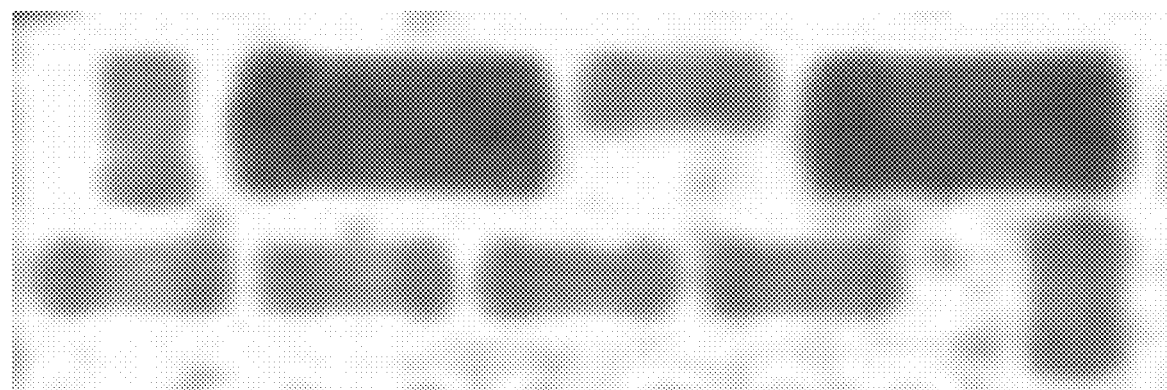

In FIG. 3E-1 and FIG. 3E-2, a comparison result between reflowed solder paste using the conventional method and using the present method are shown. FIG. 3E-1 and FIG. 3E-2 show X-ray inspections of an electronic package formed with conventional method and the present method, respectively. In the second row of each figure, four C01005-type electronic components are mounted, and a distance between every two adjacent electronic components is 40 um. For the second and the third electronic components in the second row, it can be seen that, in the conventional method, the peripheries of some gray areas (i.e., solder paste) of these components are in contact with each other, indicating that a solder bridge is formed therebetween after reflowing. While in the present method, the peripheries of gray areas (i.e., solder paste) of these components are not in contact with each other, indicating that there is no solder bridge.

Figure 4:
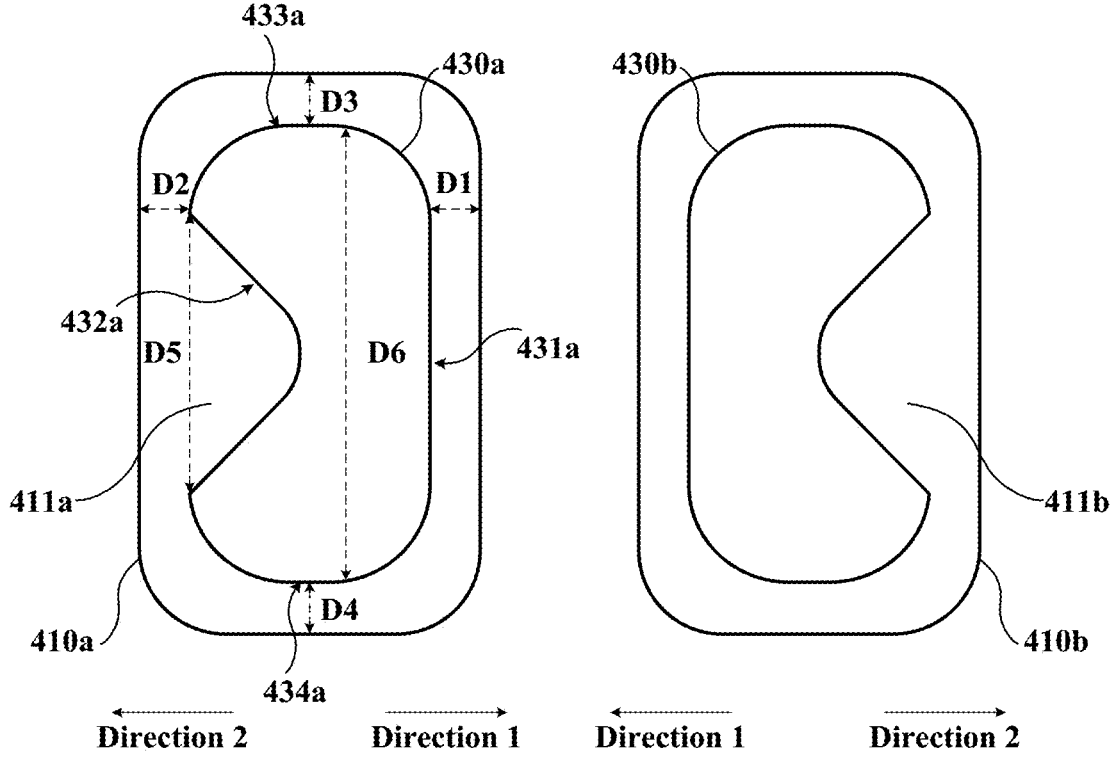
FIG. 4 illustrates an enlarged view of a set of conductive pads according to an embodiment of the present application.
Figure 5:
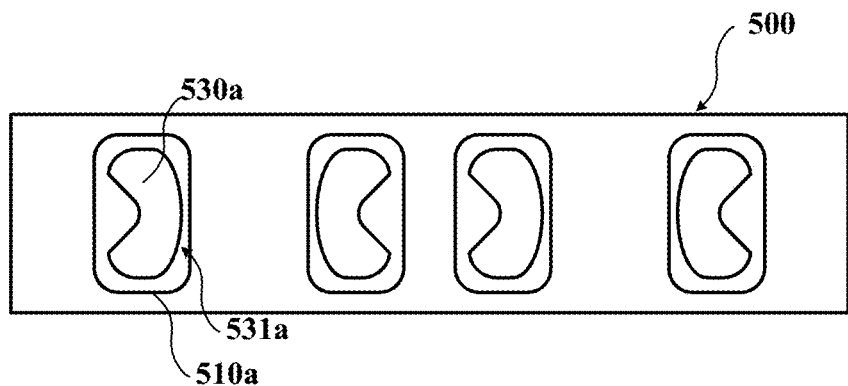
FIGS. 5 and 6 illustrate top views of two sets of conductive pads according to two embodiments of the present application.
Figure 6:
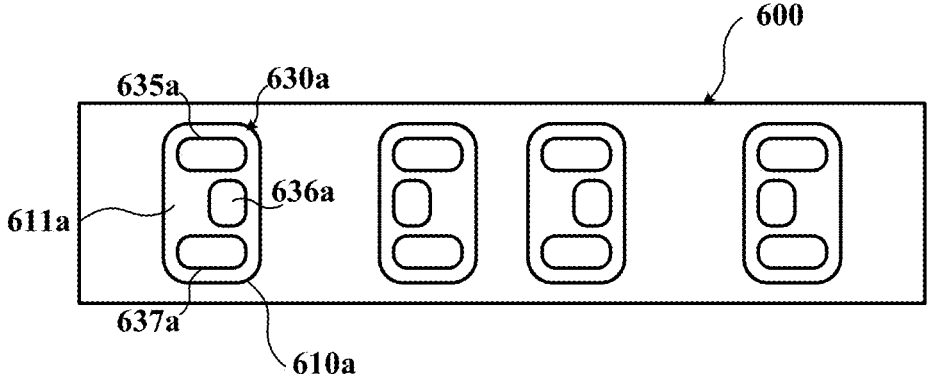

Further, the following figures illustrate the shape of a solder paste more specifically. FIG. 4 illustrates an enlarged view of a set of conductive pads and solder pastes thereon according to an embodiment of the present application. FIGS. 5 and 6 illustrate top views of two sets of conductive pads and solder pastes according to an embodiment of the present application.

Referring to FIG. 4, an embodiment of a set of conductive pads and solder pastes thereon is shown. According to the embodiment, each of a set of conductive pads 410a and 410b may take a form of a rounded rectangle. The set of conductive pads may generally define two directions, i.e. a direction facing toward the other conductive pads and a direction facing away from the other conductive pads. Specifically, Direction 1 is a direction facing toward the other conductive pad of the same set and Direction 2 is a direction facing away from the other conductive pad. On top of the set of conductive pads 410a and 410b, solder pastes 430a and 430b are formed. Each of solder pastes 430a and 430b exposes a portion of a surface of the conductive pads 410a and 410b, respectively. Specifically, the solder paste 430a exposes a portion 411a of a surface of the conductive pad 410a, wherein the portion 411a is facing Direction 2, i.e. a direction facing away from the other conductive pad. Meanwhile, in some embodiments, the solder paste 430a does not substantially expose another portion of the surface of the conductive pad 410a that faces towards the other of the first set of conductive pads. That is, the solder paste 430a generally covers an area of the conductive pad 410a facing Direction 1. Similarly, the solder paste 430b exposes a portion 411b facing Direction 2, i.e. a direction facing away from the other conductive pad. Meanwhile, in some embodiments, the solder paste 430b generally covers an area of the conductive pad 410b facing Direction 1. Preferably, the exposed portion 411a or 411b of the surface of the conductive pad 410a or 410b is of 10% to 40% of an area of the conductive pad 410a or 410b.

Further refer to FIG. 4, more specifically, the position of the solder paste 430a on top of the conductive pad 410a is illustrated as follows. In some embodiments, the solder paste 430a defines a paste periphery, which has an inner edge 431a, an outer edge 432a, a first lateral edge 433a and a second lateral edge 434a. The inner edge 431a is an edge in a direction facing toward the other conductive pad 410b, i.e., an edge at Direction 1 with respect to the pad 410a. The outer edge 432a is at a direction facing away from the other conductive pad 410b, i.e., an edge at Direction 2 with respect to the pad 410a. In some embodiments there exist distances D1, D2, D3 and D4 from the paste periphery and a periphery of the conductive pad 410a in the inner, outer, first lateral and second lateral directions. As for the outer edge 432a, it may be preferably a concave curve that defines a gap exposing the portion 411a of the surface of the conductive pad 410a. Preferably, the gap is in the middle of the outer edge 432a. Preferably, a width D5 of the gap is ranging from 30% to 90% of a length of the outer edge 432a. As for the inner edge 431a, it is preferably linear. Preferably, both the inner edge 431a and the outer edge 432a do not reach the periphery of the conductive pad 410a. In some embodiments, the distance D1 is smaller than the distance D2 such that after a reflow process, the risk of the solder paste 430a to flow outside the conductive pad 410a at Direction 2, and further, to form a solder bridge with solder paste under other electronic components is further decreased. As shown in FIG. 4, each of the solder pastes 430a, 430b generally takes a shape of a rounded rectangle with a gap at its outer edge. The solder pastes 430a, 430b may also take other forms as illustrated below.

Referring to FIG. 5, an inner edge of a solder paste may be curved. In an embodiment, an inner edge 531a of a solder paste 530a may be curved. Compared to having a linear inner edge as shown in FIG. 4, the solder paste 530a having a curved inner edge may have a larger amount of solder paste material, occupying a larger area on top of a surface of a conductive pad 510a. Therefore, in a reflow process, such solder paste with curved inner edge may provide a more stable contact between an electronic component to be mounted thereon and the conductive pad 510 underneath. It can be appreciated that the shape of other edges may also take any suitable linear or curved shape.

Referring to FIG. 6, each solder paste may not be an integral paste but may include multiple sub-pastes that are not connected with each other before the reflow process. In an embodiment, a substrate 600 includes two sets of conductive pads. On top of each conductive pad, a solder paste including three sub-pastes is formed. Take the conductive pad 610a as an example, a solder paste 630a includes three sub-pastes 635a, 636a and 637a formed on top of the conductive pad 610a. Similar to the above embodiments, the three sub-pastes generally expose a portion 611a of a surface of the conductive pad 610a, wherein the portion 611a faces away from the other conductive pad of the same set. It can be appreciated that a solder paste may also include any number of sub-pastes at any position so long as a portion facing away from the other conductive pads of the same set is generally exposed. It can also be appreciated that solder pastes on top of the same set of conductive pads may take different forms. It can also be appreciated that, in the case that a set of conductive pads includes three or more number of conductive pads, there still exists a direction of facing away from the other conductive pads of the same set, and the embodiments shown above may be easily adapted.

FIG. 7 illustrates a part of a stencil 700 for forming a solder paste shown in FIG. 3B-1 according to an embodiment of the present application. The stencil 700 has two sets of openings 770 and 780, wherein each opening has a shape of the solder paste desired to be formed. It can be appreciated that the shapes of the openings 770a, 770b, 780a and 780b may vary according to the shape of the solder paste desired to be formed. Preferably, a screen-printing process may be taken with the stencil 700 to form the solder paste. In some embodiments, solder paste material may be applied across a top surface of the stencil 700 with a squeegee. Preferably, the stencil 700 includes such as a metal material. Preferably, the stencil 700 is fabricated using standard methods such as electroforming. It can be appreciated that a thickness of the stencil 700 may vary according to the amount of the solder paste desired to be formed. Preferably, instead of having a right-angled corner, the sets of openings 770 and 780 may have curved corner, such that solder paste material may smoothly flow at the corner positions, not blocking the corner positions during the screen-printing process.

As illustrated above, compared to the conventional solder paste setting, the present application reduces the risk of forming a solder bridge between adjacent electronic components by a specifically designed solder paste pattern.

The discussion herein included numerous illustrative figures that showed various portions of an electronic package and method of forming thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. An electronic component, comprising:

a substrate;

a first set of conductive pads on the substrate and at which a set of terminals of a first electronic component are to be mounted, respectively;

a second set of conductive pads on the substrate and at which a set of terminals of a second electronic component are to be mounted, respectively; and solder paste formed on each of the first set of conductive pads and each of the second set of conductive pads, wherein the solder paste exposes a portion of a surface of a conductive pad of the first set of conductive pads that is facing away from the others of the first set of conductive pads but does not substantially expose another portion of the surface of the conductive pad that is facing towards the others of the first set of conductive pads, wherein the solder paste on a conductive pad of the first set of conductive pads defines a paste periphery having an outer edge facing away from the others of the first set of conductive pads and defining a gap exposing the portion of the surface of the conductive pad of the first set of conductive pads, and wherein the gap faces towards a conductive pad of the second set of conductive pads such that the solder paste underneath the first and second electronic components does not form a solder bridge after its reflow process.

2. The electronic component of claim 1, wherein the solder paste formed on each conductive pad defines a paste periphery having an inner edge and an outer edge, wherein the outer edge is of a concave curve that defines a gap for exposing the portion of the surface of the conductive pad.

3. The electronic component of claim 2, wherein the gap of the outer edge of the solder paste is in the middle of the outer edge.

4. The electronic component of claim 2, wherein the inner edge of the solder paste is generally linear.

5. The electronic component of claim 2, wherein both of the inner edge and the outer edge of the solder paste do not reach a periphery of the corresponding conductive pad.

6. The electronic component of claim 2, wherein a width of the gap is ranging from 30% to 90% of a length of the outer edge.

7. The electronic component of claim 1, wherein a distance between two nearest conductive pads of the first and second sets of conductive pads is less than 65 μm.

8. The electronic component of claim 7, wherein the distance between two nearest conductive pads of the first and second sets of conductive pads is ranging from 40 μm to 65 μm.

9. The electronic component of claim 1, wherein the portion of the surface of each conductive pad exposed from the solder paste is of 10% to 40% of an area of the conductive pad.

* * * * *